United States Patent [19]

Tanaka et al.

[11] Patent Number: 5,410,957
[45] Date of Patent: May 2, 1995

[54] SCREEN PRINTING APPARATUS

[75] Inventors: Yukio Tanaka; Kenichi Yamada; Taketsugu Ogura, all of Nagaokakyo, Japan

[73] Assignee: Murata Manufacturing Co., Ltd., Nagaokakyo, Japan

[21] Appl. No.: 112,567

[22] Filed: Aug. 26, 1993

[30] Foreign Application Priority Data

Aug. 28, 1992 [JP] Japan .................. 4-229597

[51] Int. Cl.⁶ .................. B05C 17/06; B41F 15/00
[52] U.S. Cl. .................. 101/127; 118/46; 29/746; 101/114; 101/123; 101/127.1; 101/126
[58] Field of Search .............. 101/114, 118, 119, 127, 101/123, 127.1, 126, 121; 118/46, 213, 301; 29/846, 745, 746

[56] References Cited

U.S. PATENT DOCUMENTS

| | | | |
|---|---|---|---|
| 4,724,761 | 2/1988 | Bubley | 101/127.1 |
| 4,729,306 | 3/1988 | Bubley | 101/114 |
| 5,048,417 | 9/1991 | Everroad | 101/123 |
| 5,171,721 | 12/1992 | Nanataki et al. | 501/81 |
| 5,202,705 | 4/1993 | Asano et al. | 346/159 |
| 5,278,007 | 1/1994 | Nanataki et al. | 429/247 |

*Primary Examiner*—Edgar S. Burr
*Assistant Examiner*—Lynn D. Hendrickson
*Attorney, Agent, or Firm*—Ostrolenk, Faber, Gerb & Soffen

[57] ABSTRACT

A screen printing apparatus includes a screen frame disposed above a ceramic green-sheet, and a screen on which an electrode pattern is formed is held by the screen frame. A cover is detachably attached to the screen frame by making a recess formed on upper surface of the screen frame engage with a projection formed on a lower end surface of the cover. An interior of the cover becomes an airtight state substantially except for a stitch portion of the screen. Therefore, when a vapor pressure of a volatile solvent of an electrode paste becomes to be saturated in the interior of the cover after volatilization of the volatile solvent to some extent, the volatile solvent of the electrode paste is prevented from further volatilizing.

6 Claims, 4 Drawing Sheets

F I G. 1
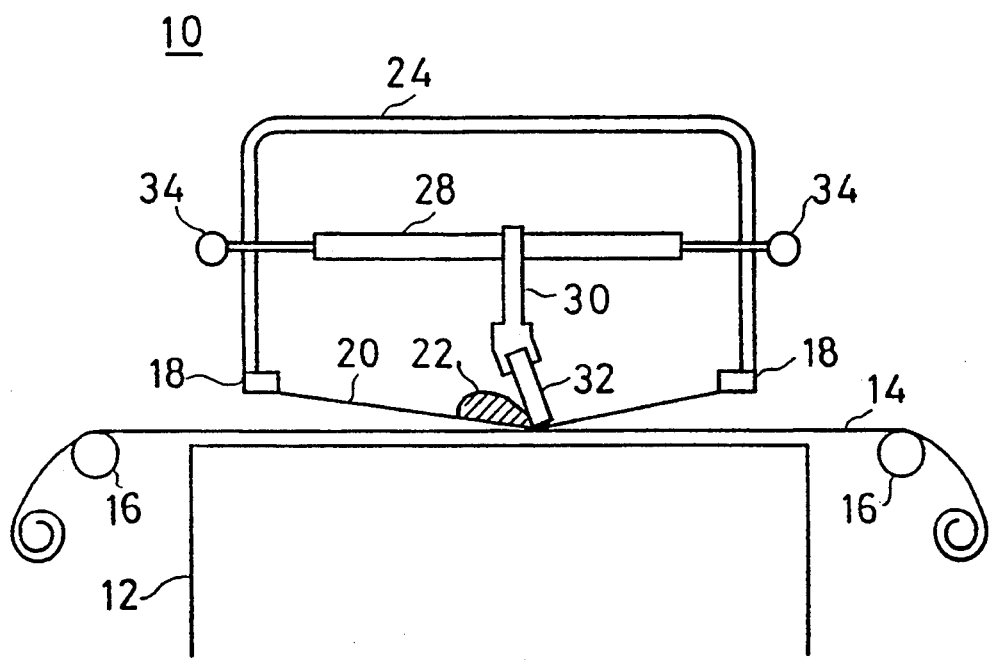
F I G. 2
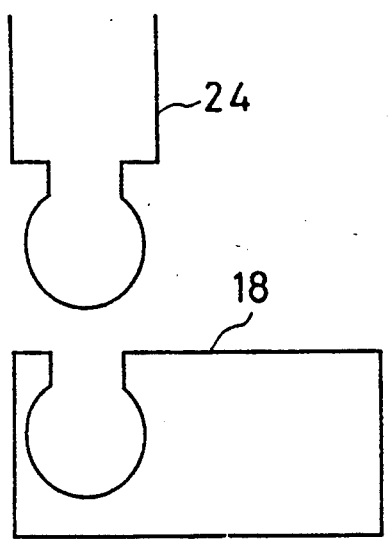

SCREEN PRINTING APPARATUS

BACKGROUND OF THE INVENTION

1. Field of the Invention

The present invention relates to a screen printing apparatus. More specifically, the present invention relates to an electrode printing apparatus which is utilized for forming inner electrodes of ceramic electronic components such as laminated capacitors, multi-layered printed circuit boards, LC composite components, and etc.

2. Description of the Prior Art

In a conventional electrode printing apparatus 1 shown in FIG. 7, there is a gap G between a lower edge of cover 3 provided on a screen 2 and a sheet-like ceramic green-sheet 4. Therefore, in the conventional electrode printing apparatus 1, a volatile solvent of a printing ink, i.e. electrode paste 5 supplied on an upper surface of the screen 2, volatilizes during printing, and therefore, a viscosity of the electrode paste 5 increases, and thus, a thickness of a printed electrode becomes large. Therefore, there was a problem in the conventional electrode printing apparatus 1 that printing quality, that is, quality of an electrode (not shown) on the ceramic green-sheet 4 changed during the printing.

SUMMARY OF THE INVENTION

Therefore, a principal object of the present invention is to provide a novel screen printing apparatus.

Another object of the present invention is to provide a screen printing apparatus capable of preventing variation of printing quality.

Another object of the present invention is to provide an electrode printing apparatus in which a thickness of an electrode can be made constant.

A screen printing apparatus according to the present invention comprises: a screen frame disposed above a member to be printed; a screen held by the screen frame; a cover attached to the screen frame for making an interior of the cover airtight substantially; and a squeegee provided within the interior of the cover and moved in a state where the squeegee is brought into contact with an upper surface of the screen.

By fixing an edge of the cover to the screen frame, the interior of the cover achieves an airtight state substantially. Therefore, when a vapor pressure of a solvent of a printing ink within the interior of the cover achieves a saturated state due to volatilization of the solvent to some extent, it becomes difficult for the solvent to volatilize, and therefore, it is possible to prevent a viscosity of the printing ink from becoming too large.

In accordance with the present invention, since the viscosity of the printing ink is not changed, the thickness of a printed portion becomes constant, and therefore, variation of printing quality can be prevented.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing one embodiment according to the present invention;

FIG. 2 is a cross-sectional view showing an engaging portion between a screen frame and an edge of a cover in FIG. 1 embodiment;

DETAILED DESCRIPTION OF THE PREFERRED EMBODIMENTS

Figure 3:
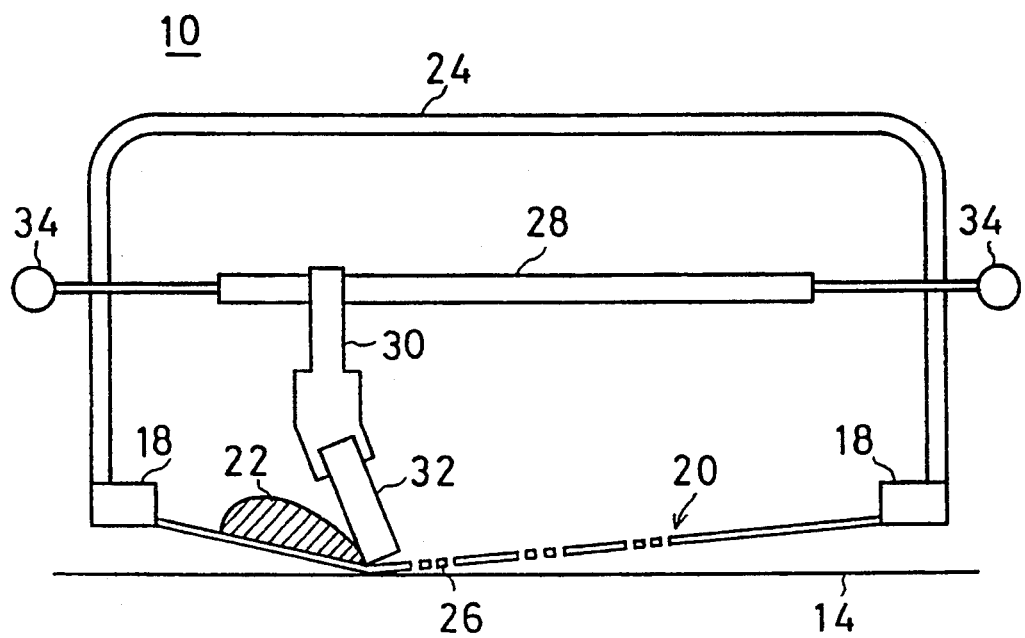
FIG. 3 is an enlarged view showing an interior of the cover of the FIG. 1 embodiment.
Figure 7:
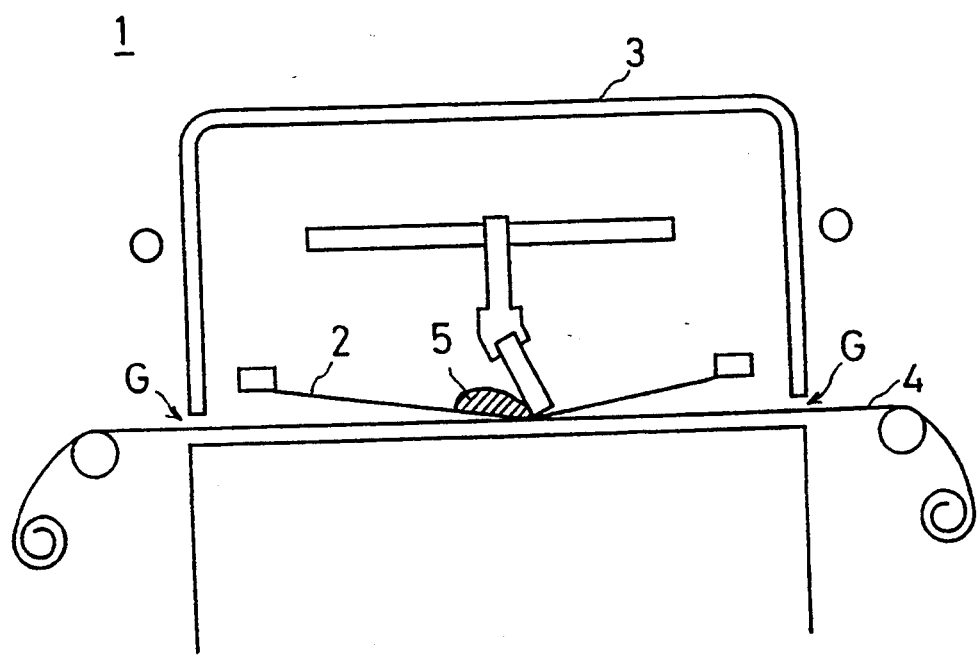
FIG. 7 is a cross-sectional view showing a prior art device.

As shown in FIG. 1, a screen printing apparatus, that is, an electrode printing apparatus 10 of this embodiment includes a working table 12. A member to be printed, that is, a ceramic green-sheet 14 for fabricating laminated ceramic capacitors, for example, is disposed on the working table 12, and the ceramic green-sheet 14 can be moved by rollers 16. There is provided a rectangular screen frame 18 above the ceramic green-sheet 14, and edges of a screen 20, on which an electrode pattern to be printed is formed, are held by the screen frame 18. Furthermore, a printing ink, that is, an electrode paste 22 including a metallic powder and a volatile solvent, is supplied on an upper surface of the screen 20.

A cover 24 made of rubber, for example, is disposed above the screen 20, and a lower edge of the cover 24 is detachably attached to the screen frame 18 by a rubber packing as shown in FIG. 2. Therefore, an interior of the cover 24 is made airtight except for a stitch portion 26 formed in the screen 20 as shown in FIG. 3, and therefore, the electrode paste 22 is not dried beyond a predetermined limit. More specifically, even if the volatile solvent of the electrode paste 22 volatilizes, since an upper portion of the screen 20, that is, the interior of the cover 24, is in an airtight state, substantially, a vapor of the volatile solvent is saturated, and accordingly, the volatile solvent is prevented from volatilizing further. In addition, a material of the cover 24 is not limited to rubber, and the same may be one that can prevent the volatilization of the volatile solvent by sealing the interior of the cover.

A squeegee guide 28 is arranged within the interior of the cover 24, and a squeegee holding member 30 is attached to the squeegee guide 28 such that the squeegee holding member 30 is movable in a direction parallel to the squeegee guide 28. Furthermore, a tip end of the squeegee holding member 30 is mounted with a squeegee 32. An air-cylinder 34 is arranged outside the cover 24, and connected to the squeegee guide 28 through the cover 24. Therefore, the squeegee holding member 30 is movable by the air-cylinder 34. Accordingly, the squeegee 32 can move slidably on the upper surface of the screen 20 such that the electrode paste 22 is adhered onto the ceramic green-sheet 14 through the electrode pattern formed in the stitch portion 26 of the screen 20, whereby an electrode having a pattern the same as the pattern formed on the screen 20 is printed on the ceramic green-sheet 14.

In such a screen printing apparatus, that is, the electrode printing apparatus 10, a portion of the ceramic green-sheet 14 on which an electrode is to be printed is moved below the screen 20 by the rollers 16, and then, the squeegee 32 is moved on the upper surface of the screen 20 by the air-cylinder 34, and therefore, the electrode having the pattern the same as the pattern formed on the screen 20 is printed or formed on the ceramic green-sheet 14.

After the printing, the ceramic green-sheet 14 is moved again by the rollers 16, and a portion to which an electrode is newly printed on the ceramic green-sheet 14 is brought below the screen 20.

According to the above described embodiment, since the cover 24 can be miniaturized, the screen printing apparatus, that is, the electrode printing apparatus 10, can be made compact. Furthermore, since it is possible to prevent the electrode paste 22 from being dried, and therefore, a paste that is easily dried can be used, it is possible to shorten a time until the electrode paste 22 is dried after the same is printed on the ceramic green-sheet 14. Thus, it is possible to prevent a disadvantage of prior art devices, i.e., that the ceramic green-sheet 14 is swollen and dissolved by the volatile solvent of the electrode paste.

Figure 4:
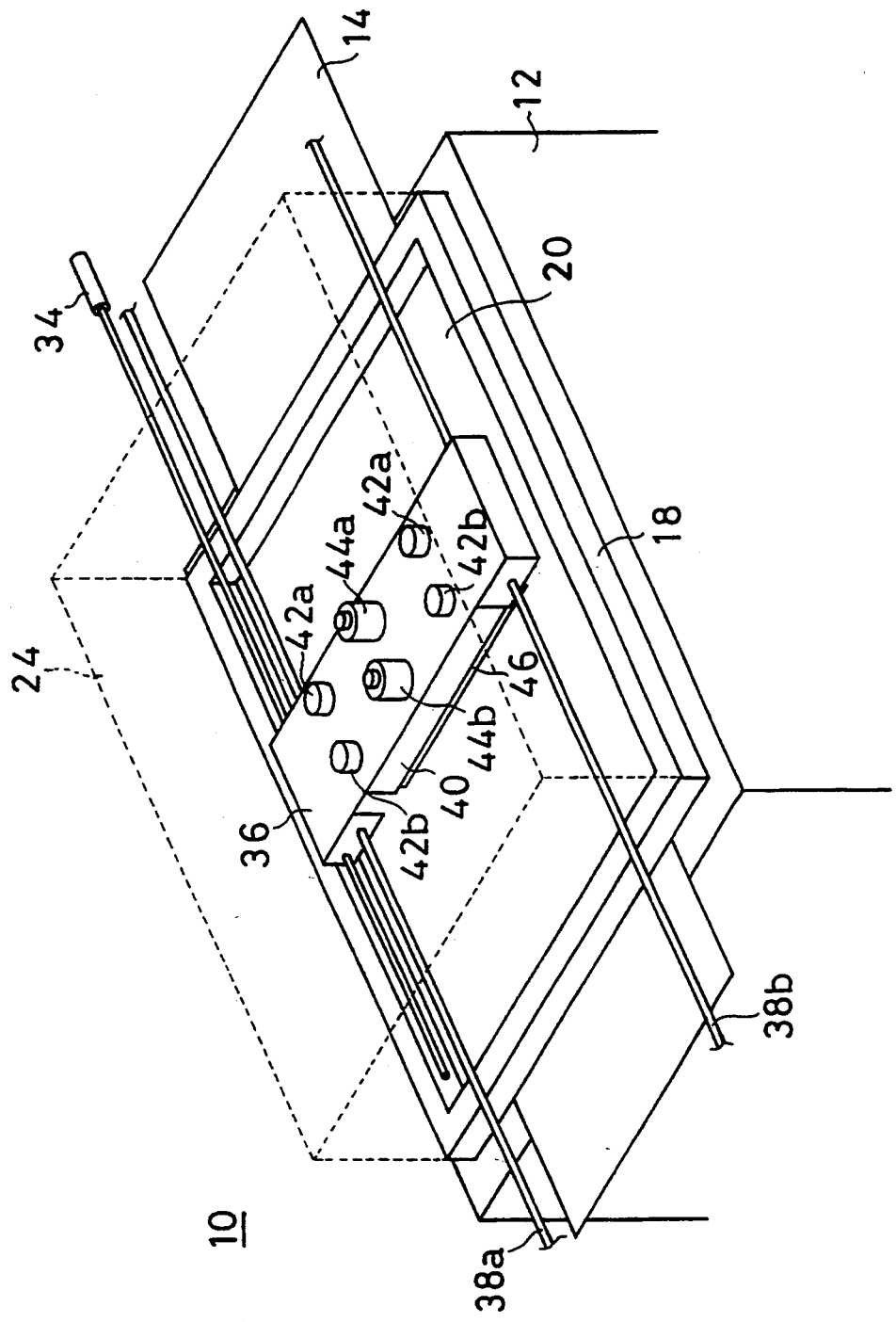
FIG. 4 is a perspective view showing another embodiment according to the present invention.
Figure 5:
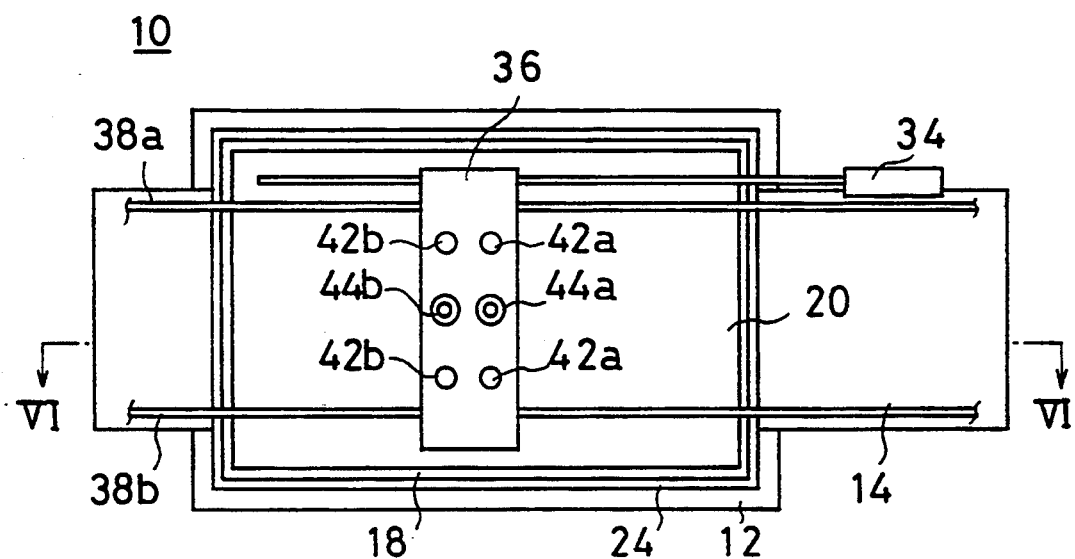
FIG. 5 is a cross-sectional view at a line V—V in FIG. 6.
Figure 6:
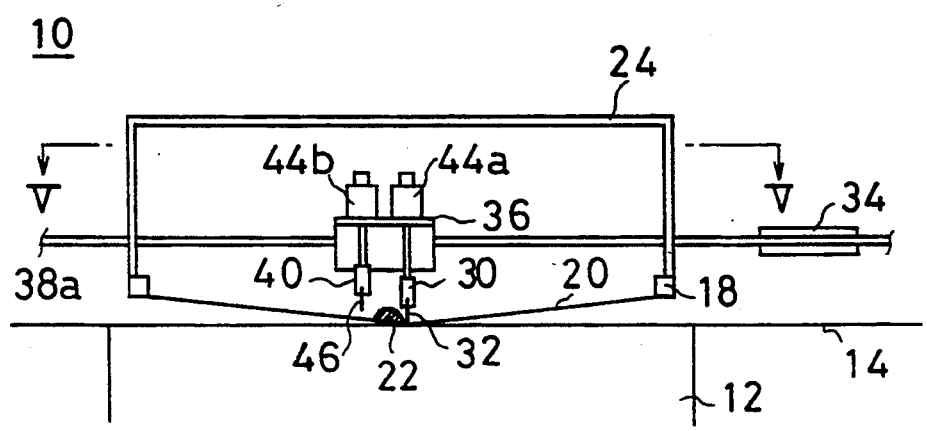
FIG. 6 is a cross-sectional view at a line VI—VI in FIG. 5.

As a specific screen printing apparatus, that is, an electrode printing apparatus 10 to which the present invention is applied, one shown in FIG. 4 to FIG. 6 can be considered. More specifically, on an upper surface of the working table 12, the ceramic green-sheet 14 is disposed, and the screen frame 18 is arranged above the ceramic green-sheet 14. Edge portions of the screen 20, on which a printing figure having a predetermined pattern is formed and the electrode paste 22 is supplied, are held by the screen frame 18. Furthermore, an upper portion of the screen frame 18 is covered by the cover 24 airtightly by detachably attaching the edge of the cover 24 to the screen frame 18. A movable member 36 is arranged above the screen 20 and within the interior of the cover 24 by supporting rods 38a and 38b. Then, the movable member 36 can be moved above the screen 20 by the air-cylinder 34. The movable member 36 is loaded with squeegee holding members 30 and 40 by attaching members 42a and 42b, respectively, and the squeegee holding members 30 and 40 are moved in an up-down direction by cylinders 44a and 44b, respectively. Squeegees 32 and 46 are attached to tip ends of the squeegee holding members 30 and 40, respectively, and the squeegees 32 and 46 can be moved on the screen 20. In addition, the squeegee 46 is used for returning the electrode paste remains on the screen 20 after the printing, and the squeegee 32 is used for printing the electrode.

In the above described electrode forming apparatus 10, by moving the movable member 36 and thus the squeegee 32 by the air-cylinder 34, an electrode (not shown) having a predetermined pattern is printed on a surface of the ceramic green-sheet 14 by the electrode paste 22 including a metallic powder and a volatile solvent.

In addition, in the embodiments, the air-cylinder is utilized, but the same may be replaced with a servomotor.

Furthermore, in the above described embodiments, the screen printing apparatus is utilized as an electrode printing apparatus; however, it is needless to say that the present invention can be applied with an arbitrary screen printing apparatus that is utilized for another purpose.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode printing apparatus for printing an electrode comprising an electrode paste including metallic powder and volatile solvent on a ceramic green-sheet, the apparatus comprising:
    a support for supporting a ceramic green-sheet;
    a screen frame disposed above the support;
    a screen held by the screen frame for receiving electrode paste;
    a cover attached to the screen frame, the interior of the cover being substantially airtight such that vapor from the volatile solvent can become saturated in the interior; and
    a squeegee mounted within the interior of the cover and movable along an upper surface of the screen for applying electrode paste through the screen to the ceramic green-sheet without reducing said substantial airtightness of the cover.

2. An electrode printing apparatus according to claim 1, wherein the screen frame includes a first engaging portion, and the cover includes a second engaging portion, and by engaging the first and second engaging portions with each other, the cover is detachably attached to the screen frame.

3. An electrode printing apparatus according to claim 2, wherein the first engaging portion includes a recess formed on an upper surface of the screen frame, and the second engaging portion is a projection formed on a lower end surface of the cover.

4. The electrode printing apparatus according to claim 1, further comprising a squeegee guide movably arranged within the interior of the cover.

5. The electrode printing apparatus according to claim 4, further comprising an air cylinder arranged outside the cover and attached to the squeegee guide through the cover for moving the squeegee.

6. The electrode printing apparatus according to claim 5, further comprising a squeegee holding member attached to the squeegee guide and arranged within the interior of the cover, for being moved by the squeegee guide and thereby moving the squeegee along the upper surface of the screen.

* * * * *